United States Patent [19]

Akimoto et al.

[11] Patent Number: 5,016,108

[45] Date of Patent: May 14, 1991

[54] SOLID-STATE IMAGING DEVICE HAVING SERIES-CONNECTED PAIRS OF SWITCHING MOS TRANSISTORS FOR TRANSFERRING SIGNAL ELECTRIC CHARGES THERETHROUGH

[75] Inventors: Hajime Akimoto, Hachioji; Shinya Ohba, Kanagawa, both of Japan

[73] Assignee: Hitachi, Ltd., Tokyo, Japan

[21] Appl. No.: 214,514

[22] Filed: Jul. 1, 1988

[30] Foreign Application Priority Data

Jul. 2, 1987 [JP] Japan ................... 62-163916

[51] Int. Cl.$^5$ .................. H04N 3/12; H04N 3/14; H04N 5/335
[52] U.S. Cl. ................. 358/212; 358/213.27; 358/213.15
[58] Field of Search ............ 348/213.15, 213.18, 348/213.27, 212

[56] References Cited

U.S. PATENT DOCUMENTS

| | | | |
|---|---|---|---|
| 4,496,980 | 1/1985 | Pfleiderer et al. | 358/212 |
| 5,547,806 | 10/1985 | Herbst et al. | 358/212 |

Primary Examiner—James J. Groody
Assistant Examiner—Wendy R. Greening
Attorney, Agent, or Firm—Antonelli, Terry, Stout & Kraus

[57] ABSTRACT

A solid-state imaging device has a plurality of light receiving elements formed in a semiconductor substrate. Signal electric charges generated by light incident upon the light receiving elements and stored in the individual light receiving elements are sequentially read out through signal lines by scanning a plurality of switches. Each of the switches includes a series connection of a first MOS transistor switching element formed in the semiconductor substrate and a second MOS transistor formed in a semiconductor provided above the semiconductor substrate through an insulator. The first switching element is disposed on the side of the light receiving element and the second switching element is disposed on the side of the signal output terminal.

49 Claims, 6 Drawing Sheets

SOLID-STATE IMAGING DEVICE HAVING SERIES-CONNECTED PAIRS OF SWITCHING MOS TRANSISTORS FOR TRANSFERRING SIGNAL ELECTRIC CHARGES THERETHROUGH

BACKGROUND OF THE INVENTION

1. Field of the Invention

This invention relates to an imaging device and, more particularly, to a solid-state imaging device having a semiconductor substrate on which a plurality of light receiving elements and the like are integrated.

2. Description of the Related Art

The solid-state imaging device is required to have a resolution comparable to that of an electron tube for imaging used in presently commercialized television broadcasting. To this end, it is necessary to form on the semiconductor substrate a photocell matrix in which 500 photocells (photoelectric conversion elements) are arrayed in the vertical (column) direction and 800 to 1000 photocells are arrayed in the horizontal (row) direction and scanning elements for scanning these photocells. Accordingly, such a solid-state imaging device is fabricated using MOS.LSI technology capable of realizing high density of integration and charge coupled devices (CCD's) or MOS transistors are generally used as constituents of the solid-state imaging device.

As an example, a MOS type solid-state imaging device employing switching transistors of SOI (silicon on insulator) structure will be described hereinafter.

Figure 1:
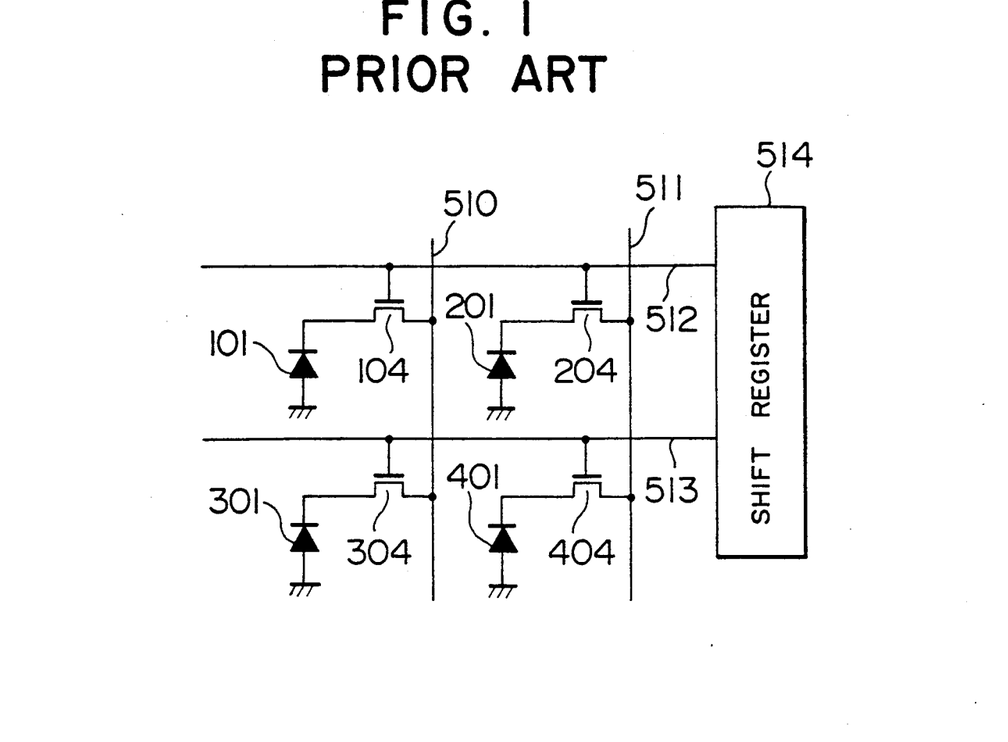
FIG. 1 is a schematic circuit diagram showing a prior art MOS type solid-state imaging device.

This type of solid-state imaging device is disclosed in IEDM 86, Technical Digest, pp. 369-372. This prior art example will be explained with reference to FIGS. 1 and 2 in the accompanying drawings. FIG. 1 is a diagram illustrating the circuit construction of the MOS type solid-state imaging device. As shown, a plurality of photodiodes 101, 201, 301 and 401 are arranged in matrix form within a p-type silicon substrate and MOS transistor switches 104, 204, 304 and 404 for selecting individual photodiodes are respectively connected to corresponding photodiodes. A set of one photodiode and one MOS transistor switch constitute one photocell. Signal lines 510 and 511 for delivery of signal electric charges are respectively connected to output terminals of the vertical (column) direction MOS transistor switches 104 and 304 and to output terminals of the vertical direction MOS transistor switches 204 and 404. The MOS transistor switches 104, 204, 304 and 404 are sequentially scanned with signals on gate lines 512 and 513 connecting to a shift register 514. This sequential scanning ensures that a signal electric charge generated by light incident upon the photodiode 101, 201, 301 or 401 is delivered through the MOS transistor switch 104, 204, 304 or 404 and the signal line 510 or 511.

Figure 2:
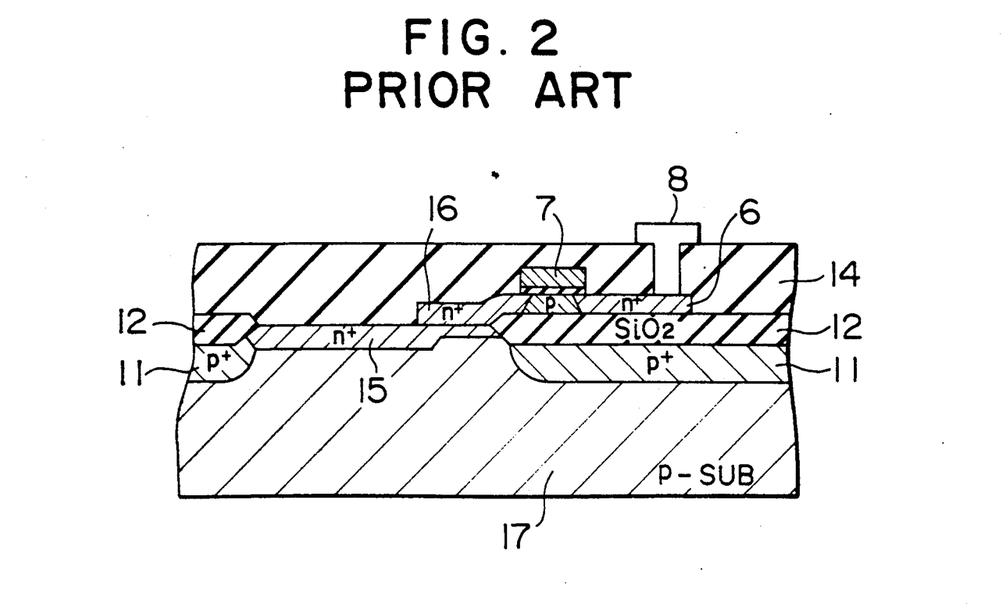
FIG. 2 is a diagram showing the sectional structure of one photodiode and the surrounding vicinity in FIG. 1.

FIG. 2 is a diagram illustrating the sectional structure of one photodiode and its neighborhood shown in FIG. 1. Formed in the p-type silicon substrate designated by reference numeral 17 is an n-type inpurity-doped region (n+ layer) 15 forming part of the photodiode and isolated by oxide films 12, and p-type impurity-doped regions (p+ diffusion layer) 11 also formed in the p-type silicon substrate 17. The oxide film 12 and p-type impurity-doped region 11 form an isolation region which isolates photocells (pixels) from each other. One MOS transistor having a source 16, a drain 6 and a gate 7 extends from the n-type impurity-doped region (n+ layer) 15 so as to overlie the oxide film 12, and a signal line 8 is connected to the drain 6. The resulting structure is covered with a protection film 14. Particularly, the MOS transistor having the source 16, drain 6 and gate 7 is formed within a SOI structure which is of recrystallized silicon prepared using the n-type impurity-doped region (n+ layer) 15 as a seeding region. Accordingly, the parasitic capacitance between drain 6 and p-type silicon substrate 17 can be minimized and consequently the parasitic capacitance associated with the signal line 8 can be minimized to suppress the output noise level. This is due to the fact that square of output noise current is proportional to the total value of capacitance associated with the signal line 8. The MOS type solid-state imaging device of the above construction is also disclosed in U.S. Pat. No. 4,551,742.

Through experiments, the present inventors have found that leakage current flowing between the source 16 and drain 6 of the MOS transistor formed within the SOI used in the prior art device is far larger than leakage current flowing through the source and drain of a MOS transistor formed by way of trial in the silicon substrate 17, and that there arises an unsolved problem that the leakage current in the MOS transistor of SOI structure leads to generation of additional noise components and loss of the signal electric charge. This problem bottlenecks putting the MOS type solid-state imaging device of SOI structure into practice.

SUMMARY OF THE INVENTION

An object of this invention is to provide a solid-state imaging device capable of taking advantage of the SOI structure to suppress the parasitic capacitance while suppressing the above problematic leakage current.

According to the invention, to accomplish the above object, individual switches for scanning comprise a series connection of a first MOS transistor switching element formed in a semiconductor substrate and a second MOS transistor switching element formed in a semiconductor provided above the semiconductor substrate through an insulator, and the first switching element is disposed on the side of a light receiving element with the second switching element disposed on the side of a signal output terminal.

Since the MOS transistor contiguous to the light receiving element is formed in the semiconductor substrate, almost no leakage current is generated in this MOS transistor. Since the MOS transistor contiguous to the signal output terminal is formed in the semiconductor overlying the insulator on the semiconductor substrate, this MOS transistor can reduce parasitic capacitance associated with the signal line.

Thus, in accordance with the invention, the parasitic capacitance associated with the signal line can be reduced by means of one transistor switch being formed in the semiconductor overlying the insulator on the semiconductor substrate and at the same time leakage current to the signal line can be suppressed by means of the other transistor switch formed in the semiconductor substrate and connected in series with the one transistor switch, thereby eventually suppressing the noise generated in the solid-state imaging device. In this manner, the prior art problem of the large leakage current in the MOS transistor giving a bottleneck to practicing the SOI technology can be solved specifically by the provision of the other MOS transistor switch formed in the substrate, and the SOI technology can be advanced to practicable technology.

These and other objects and many of the attendant advantages of this invention will be readily appreciated as the same becomes better understood by reference to the following detailed description when considered in connection with the accompanying drawings.

DESCRIPTION OF THE PREFERRED EMBODIMENTS

The invention will now be described by way of example with reference to the accompanying drawings.

Figure 3:
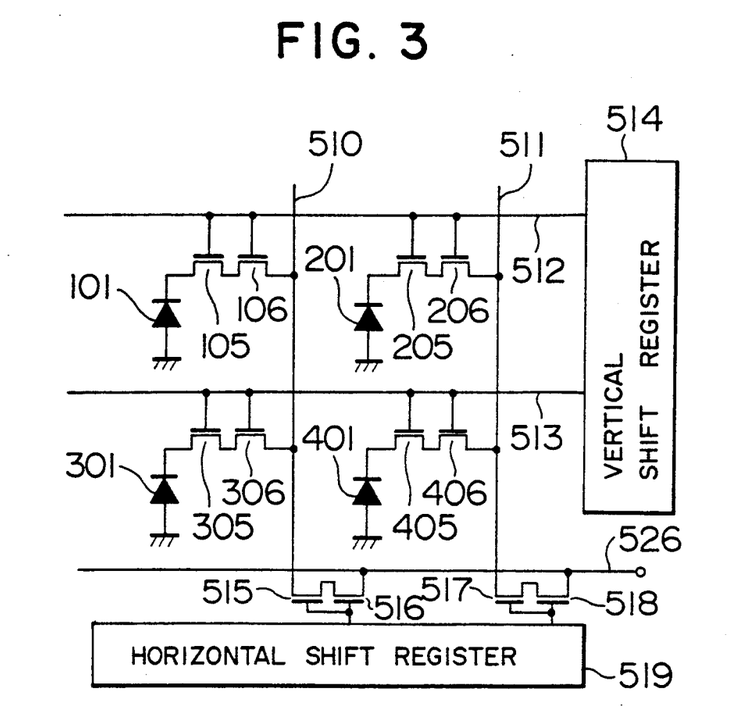
FIG. 3 is a schematic circuit diagram showing a MOS type solid-state imaging device according to an embodiment of the invention.

FIG. 3 schematically shows a MOS type solid-state imaging device according to an embodiment of the invention. In FIG. 3, identical elements to those of FIG. 1 are designated by identical reference numerals.

Photodiodes 101, 201, 301 and 401 are formed in matrix in a p-type silicon substrate (not shown). For simplicity of explanation, 2×2 or four photocells are illustrated in FIG. 3. Each photodiode is connected with two MOS transistor switches which are connected in series therewith from reference ground potential to a corresponding signal line. Taking the photodiode 101, for instance, a series connection of MOS transistor switches 105 and 106 is connected to the photodiode 101. In this embodiment, one photocell is formed of one photodiode and two MOS transistor switches serially connected therewith. Vertical signal lines 510 and 511 for delivery of signal electric charges are respectively connected to output terminals of MOS transistor switches 106 and 306 arrayed in the vertical direction (same column direction) and to output terminals of vertical direction MOS transistors 206 and 406. Signal electric charges are transferred in the vertical direction through the signal lines 510 and 511. The two MOS transistor switches 105 and 106 of one photocell are connected in common to a gate line 512 extending from a vertical shift register 514 so as to be scanned simultaneously. Thus, the vertical shift register 514 sequentially scans the vertical direction photocells (i.e. photocells along the column direction) through gate lines 512 and 513. One end of each of the vertical signal lines 510 and 511 is connected to a horizontal signal line 526 through MOS transistors 515 and 516 or MOS transistors 517 and 518. Signal electric charges from the vertical signal lines 510 and 511 are transferred to the output terminal of the device by way of the horizontal signal line 526. The MOS transistors 515, 516 and 517, 518 are sequentially scanned in the horizontal direction by means of a horizontal shift register 519. Like the MOS transistor switches 105 and 106 constituting the photocell, the MOS transistor switches 515 and 516 are connected in series, and the MOS transistors 517 and 518 are also connected in series. Reference numerals 205, 305 and 405 designate MOS transistor switches connected in series with the MOS transistor switches 206, 306 and 406, respectively.

In operation, light impinges upon the respective photodiodes 101, 201, 301 and 401 through a camera lens. Taking the photodiode 101, for instance, a signal electric charge corresponding to the incident light is stored in this photodiode 101. This signal electric charge is transferred to the vertical signal line 510 through the MOS transistor switches 105 and 106 scanned at a predetermined point of time. The signal electric charge transferred to the vertical signal line 510 is transferred to the horizontal signal line 526 through the MOS transistor switches 515 and 516 scanned at other predetermined point of time and delivered out of the output terminal to provide a video signal to be processed by an external unit. The remaining photocells operate similarly.

Figure 4:
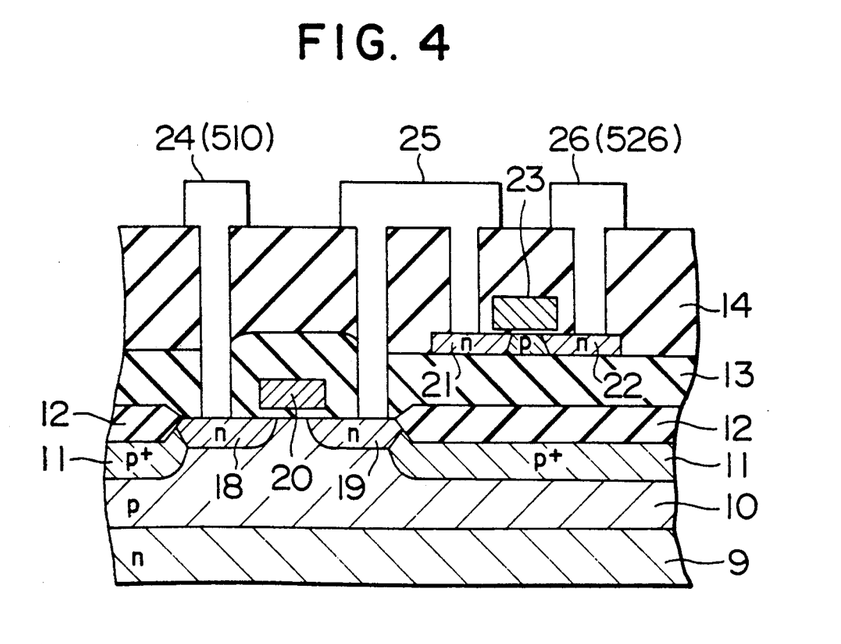
FIG. 4 is a diagram showing the sectional structure of serially connected read MOS transistors (515, 516) is FIG. 3.

Of the sets of read MOS transistor switches 515, 516 and 517, 518, a set of two MOS transistor switches 515 and 516 connected in series are illustrated in FIG. 4 to show their sectional structure. The sectional structure of the other set of MOS transistor switches 517 and 518 is similar and will not be described herein. A p-type well 10 is formed on an n-type silicon substrate 9. Formed in the p-type well 10 is an n-type MOS transistor 515 having a source 18, a drain 19 and a gate 20 and isolated by insulating films 12 made of, for example, SiO$_2$ and p-type impurity-doped regions (p+ diffusion layer) 11 also formed in the well 10. The insulating film 12 and p-type impurity-doped region form an isolation region. An insulating film 13 of, for example, SiO$_2$ is formed on the MOS transistor 515 and an n-type MOS transistor 516 having a source 21, a drain 22 and a gate 23 is formed in silicon on the insulating film 13, that is, SOI. The source 18 of MOS transistor 515 (or 517) is connected with a wiring conductor 24 made of a low resistance material such as aluminum. This wiring conductor 24 corresponds to the vertical (column) signal line 510 in FIG. 3. Similarly, the drain 19 of MOS transistor 515 and the source 21 of MOS transistor 516 in SOI are interconnected to each other by a wiring conductor 25. The drain 22 of MOS transistor 516 in SOI is connected with a wiring conductor 26 made of a low resistance material such as aluminum. This wiring conductor 26 corresponds to the horizontal signal line 526 in FIG. 3. In this way, in accordance with the present embodiment, the MOS transistor switch 515 or 517 in FIG. 3 is formed in the silicon substrate (p-type well 10) and the MOS transistor 516 or 518 is formed in silicon on the insulating film (SOI) provided on the semiconductor substrate. Accordingly, the signal electric charge is supplied to the wiring conductor 24 connected to the vertical signal line 510 and delivered out through the wiring conductor 26 connected to the horizontal signal line 526 when the gates 20 and 23 are inputted with a voltage signal from the horizontal shift register to render MOS transistors 515 and 516 on. The parasitic capacitance associated with the drain 22 of MOS transistor 516 or 518 formed in the SOI is far smaller than that associated with the drain 19 of MOS transistor 515 or 517 formed, as usual, in the silicon substrate because the drain 22 is isolated from the silicon substrate by the thick insulating film 13. Accordingly, the structure of FIG. 4 can reduce parasitic capacitance which is associated with the horizontal signal line 526 and wiring conductor 26 when the signal applied at the gates 20 and 23 render MOS transistors 515 and 516 (517 and 518) off. The problem that the leakage current flowing between the source 21 and drain 22 of the MOS transistor 516 or 518 formed in the SOI is generally large can be neglected because leakage current decreases between the source 18 and drain 19 of the MOS transistor 515 or 517 formed in the silicon substrate.

Figure 5:
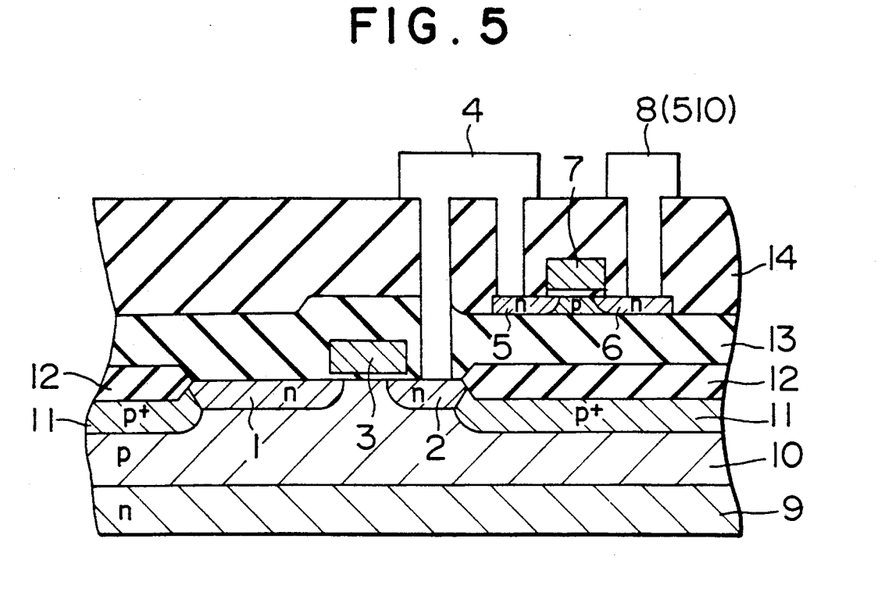
FIG. 5 is a diagram showing the sectional structure of one photocell comprised of a photodiode and two MOS transistor switches in FIG. 3.

FIG. 5 shows the sectional structure of one photocell constituted by one photodiode and two MOS transistor switches as illustrated in FIG. 3. In FIG. 5, the MOS transistor 105 is formed in the silicon substrate, having a source of an n-type impurity-doped region (n-type diffusion layer) 1 which forms part of the photodiode 101, a drain 2 of an n-type impurity-doped region near the region 1 and a gate 3 between the source and drain. The MOS transistor 106 having a source 5, a drain 6 and a gate 7 is formed in SOI. A wiring conductor 8 corresponding to the vertical (column) signal line 510 is connected to the drain 6. The drain 2 of MOS transistor 105 and the source 5 of MOS transistor 106 are interconnected together by a wiring conductor 4. The remaining elements are identical to those of the FIG. 4 structure. When the signal applied at the gates 3 and 7 renders MOS transistors 105 and 106 on, a signal charge stored in the n-type impurity-doped region (n-type diffusion layer) 1 is transferred to the wiring conductor 8 connected to the vertical signal line 510. At that time, for the same reasons as explained in connection with the FIG. 4 embodiment, parasitic capacitance associated with the vertical signal line 510 and wiring conductor 8 when the signal applied at the gates 3 and 7 renders MOS transistors 105 and 106 off can be reduced and at the same time the leakage current between the n-type diffusion layer 1 forming part of the photodiode and the vertical signal line 510 and wiring conductor 8 can be suppressed, in this embodiment of FIG. 5.

As described above, in connection with the FIG. 3 embodiment, the SOI structure has been applied to not only the MOS transistor constituting the photocell but also the MOS transistor interposed between vertical signal line 510 or 511 and horizontal signal line 526. The SOI structure may also be applied to any one of these MOS transistors. The application of the SOI structure to the two transistors, as described above, is however preferable because the effects of leakage current suppression and parasitic capacitance reduction can be more enhanced.

Figure 6:
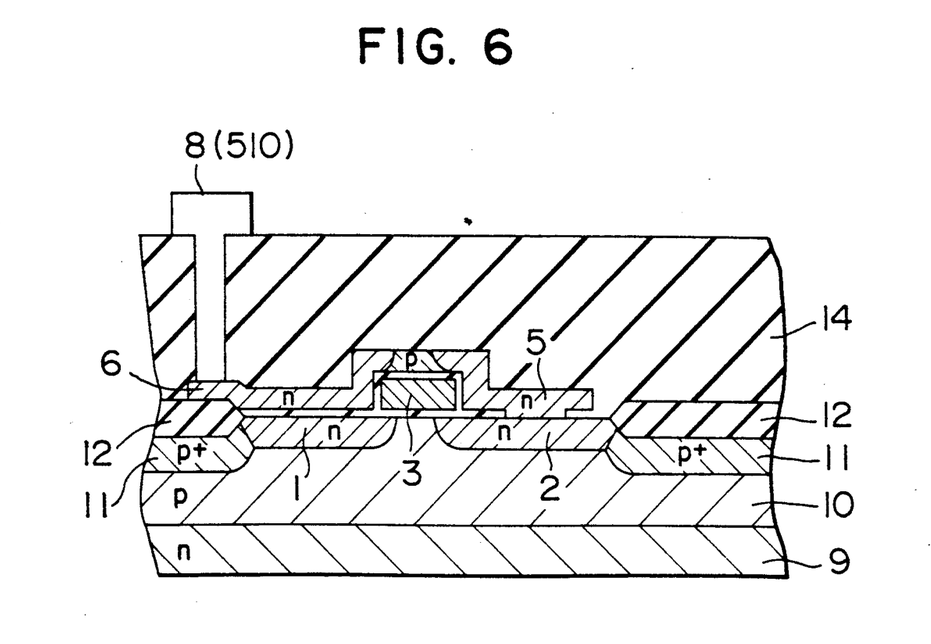
FIG. 6 is a diagram illustrating a first modification of the FIG. 5 sectional structure.

FIG. 6 illustrates, in sectional form, a first modification of the FIG. 5 embodiment. In this modification of FIG. 6, the wiring conductor 4 of FIG. 5 is omitted and the drain 2 is directly connected to the source 5. This modification is also characteristic of omission of the insulating film 13 so that the gate 3 of the MOS transistor 105 also serves as the gate of the MOS transistor 106 formed in SOI and having the source 5 and drain 6. Excepting the above, the FIG. 6 modification is identical to the FIG. 5 embodiment. Obviously, this modification can attain the same effects as brought about by the FIG. 5 embodiment and in addition, it can reduce the area per photocell because part of the MOS transistor 106 overlies the n-type diffusion layer 1 forming part of the photodiode and can advantageously realize high resolution of the solid-state imaging device. Moreover, since the SOI structure is of recrystallized silicon prepared using the drain 2 as a seeding region, the characteristic such as mobility of the MOS transistor 106 in the SOI can be improved.

Figure 7:
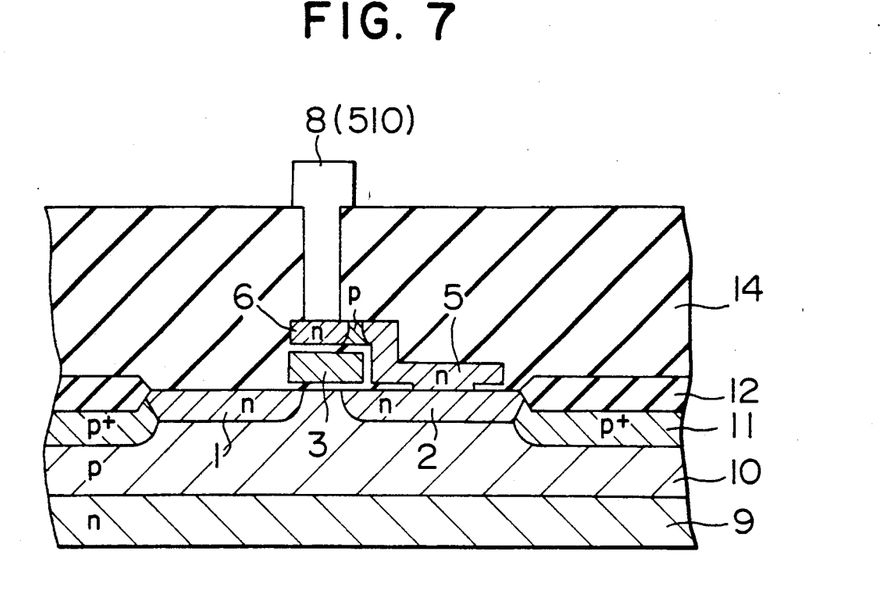
FIG. 7 is a diagram illustrating a second modification of the FIG. 5 sectional structure.

FIG. 7 illustrates, in sectional form, a second modification of the FIG. 5 embodiment. This modification of FIG. 7 is identical to the FIG. 6 modification with the only exception that the drain 6 of the MOS transistor in SOI is above the gate 3. This modification can obviously attain the same effects as the FIG. 6 modification and in addition, the drain 6 not covering the n-type diffusion layer 1 forming part of the photodiode is effective to prevent degradation in sensitivity of the solid-state imaging device.

Figure 8:
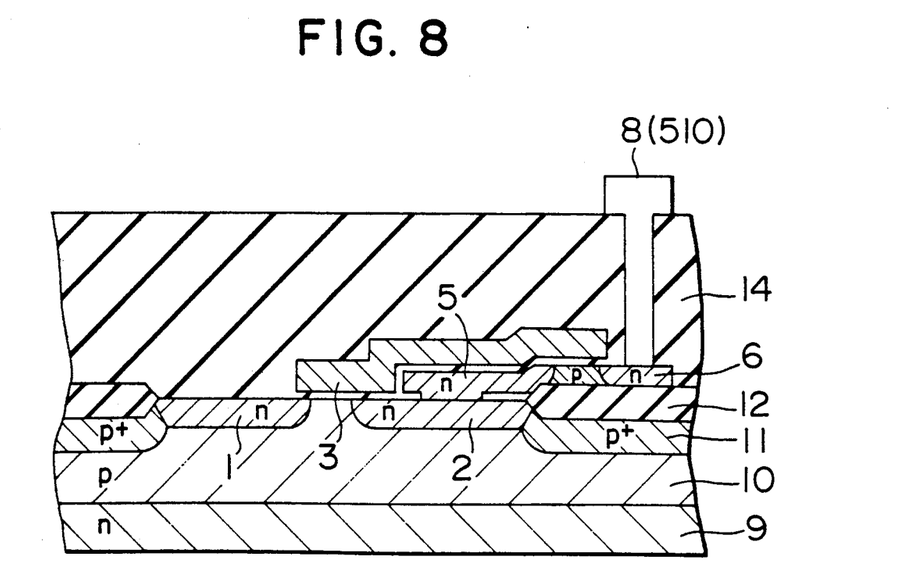
FIG. 8 shows a third modification of the FIG. 5 sectional structure.

FIG. 8 illustrates, in sectional form, a third modification of the FIG. 5 embodiment. This modification of FIG. 8 is identical to the FIG. 6 modification with the only exception that the gate 3 extends to above the source 5 and drain 6 of the MOS transistor 106 in SOI and is used in common for the MOS transistors 105 and 106. Obviously, this modification can attain the same effects as the FIG. 5 embodiment and in addition, since the SOI structure is of recrystallized silicon prepared using the drain 2 as a seeding region, the characteristic such as mobility of the MOS transistor 106 formed in the SOI can be improved.

Figure 9:
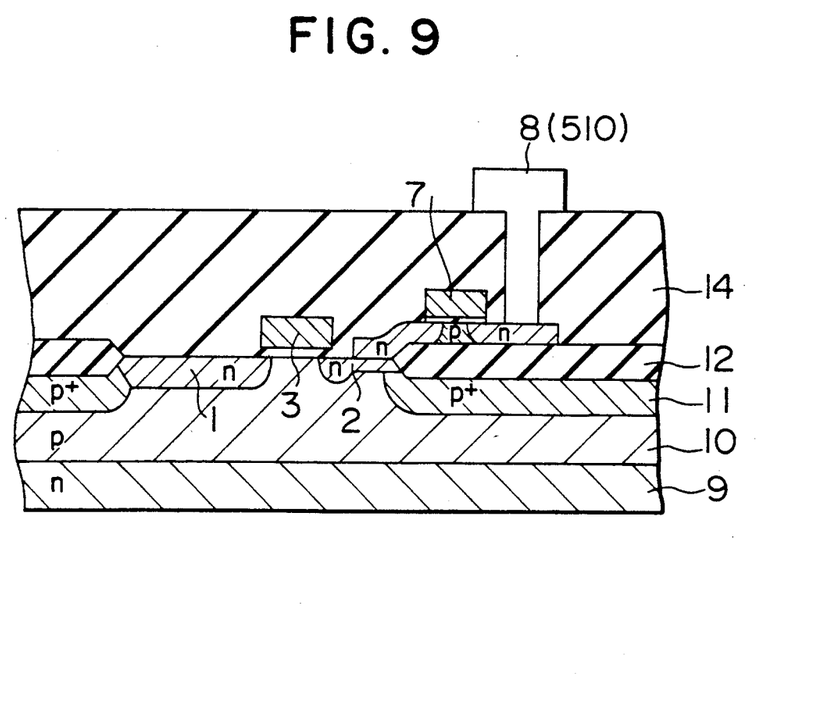
FIG. 9 shows a fourth modification of the FIG. 5 sectional structure.

FIG. 9 shows a fourth modification of the FIG. 5 embodiment. This modification of FIG. 9 is identical to the FIG. 5 embodiment, excepting that the wiring conductor 4 and insulating film 13 are omitted and the drain 2 is connected directly to the source 5. Obviously, this modification can attain the same effects as the FIG. 5 embodiment and besides since the SOI structure is of recrystallized silicon prepared using the drain 2 as a seeding region, the characteristic, such as mobility of the MOS transistor formed in the SOI and having the source 5, drain 6 and gate 7 can be improved.

Figure 10:
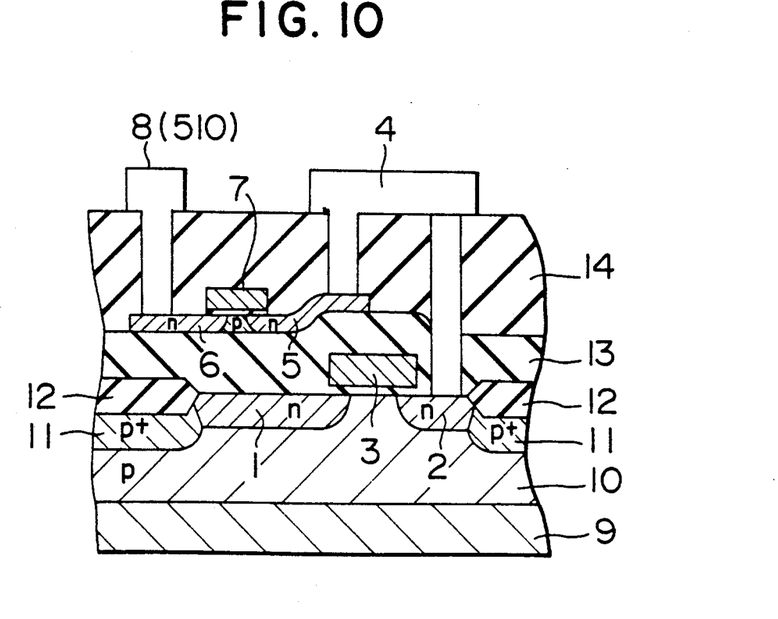
FIG. 10 shows a fifth modification of the FIG. 5 sectional structure.

FIG. 10 shows a fifth modification of the FIG. 5 embodiment which is identical thereto with the only exception that the MOS transistor in SOI is disposed above the n-type diffusion layer 1 forming part of the photodiode. Obviously, the present modification can attain the same effects as the FIG. 5 embodiment and besides, like the first modification of FIG. 6, can reduce the area per photocell to thereby realize high resolution of the solid-state imaging device. However, considering that the SOI structure intercepts part of light impinging upon the n-type diffusion layer forming the photodiode, the SOI structure is preferably made as thin as possible to enhance photo-transparence.

Figure 11:
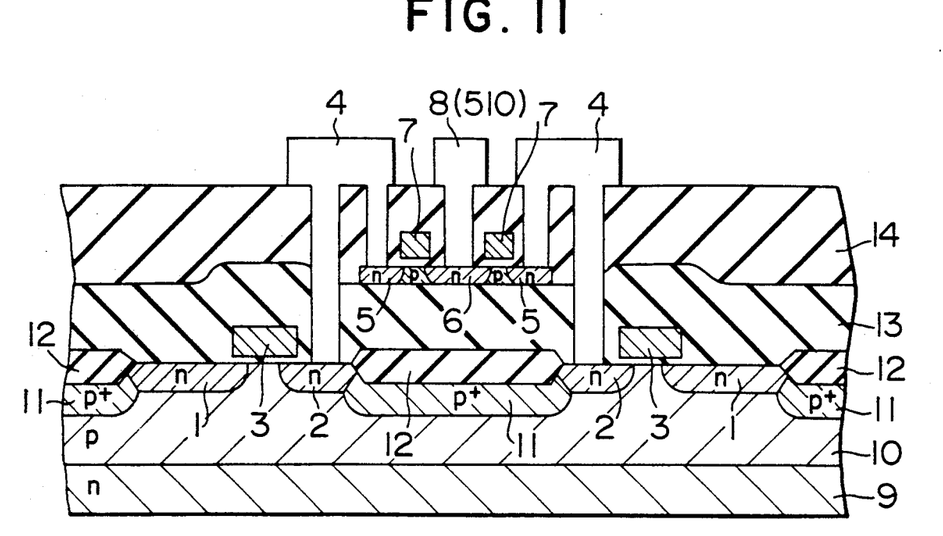
FIG. 11 shows a sixth modification of the FIG. 5 sectional structure.

FIG. 11 shows a sixth modification of the FIG. 5 embodiment. In this modification of FIG. 11, the drain 6 of the MOS transistor formed in SOI is commonly shared by a plurality of adjacent photocells. More particularly, the drain 6 is used in common for the MOS transistor switches 106 and 306 connected in common to the vertical signal line 510 in FIG. 3. Excepting the above, this modification is identical to the FIG. 5 embodiment. In accordance with the present modification, the number of contacts each used between the drain 6 and the wiring conductor 8 can be reduced to thereby reduce the area per photocell and consequently realize high resolution of the solid-state imaging device.

While in the foregoing embodiments, the solid-state imaging device has been described as having a 2×2 array of photocells, this number of photocells is only for purposes and is not to be construed as being limited thereto. The conductivity type of the semiconductors used in the foregoing embodiments may be inversed (i.e. of the p-type channel). In addition, it is not always necessary that the semiconductors be of silicon. Further, the semiconductor structure formed on the insulator in accordance with the invention may be formed either of single crystalline, polycrystalline or amorphous material.

Figure 12:
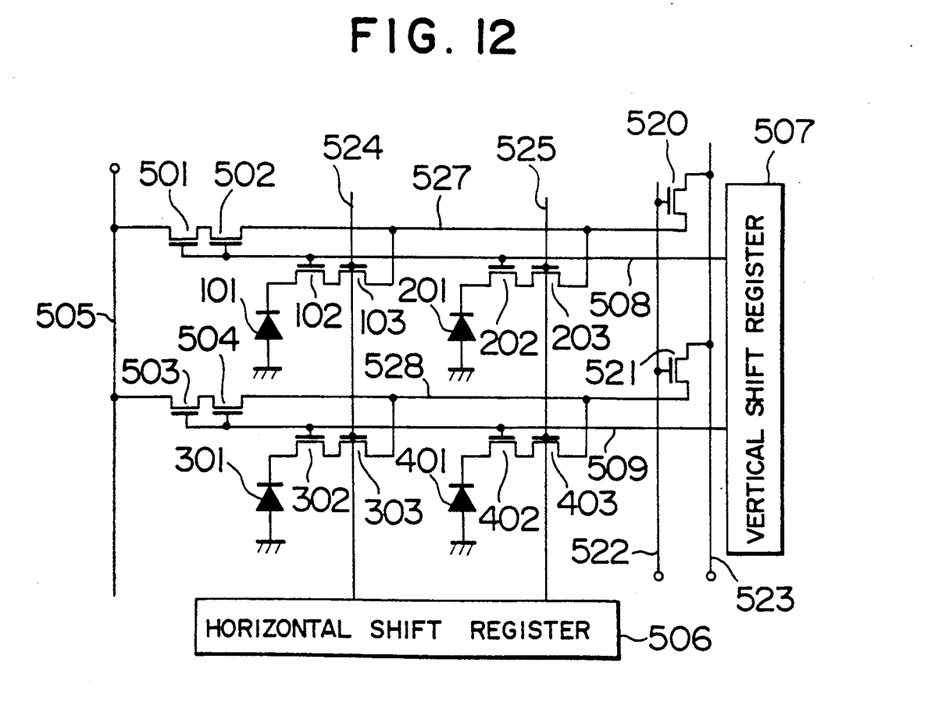
FIG. 12 is a schematic circuit diagram illustrating a modification of the FIG. 3 embodiment.

FIG. 12 schematically shows a modified embodiment of the circuit of the FIG. 3 embodiment. This modification of FIG. 12 differs from the FIG. 3 embodiment as will be described below.

Of the MOS transistors provided in association with individual photodiodes 101, 201, 301 and 401, MOS transistor switches 102, 202, 302 and 402 disposed on the side of the respective photodiodes are selected by a vertical shift register 507 through vertical gate lines 508 and 509. MOS transistor switches 103, 203, 303 and 403 disposed on the side of horizontal signal lines 527 and 528 are selected by a horizontal shift register 506 through horizontal gate lines 524 and 525. MOS transistor switches 501 and 502 for connecting the horizontal signal line 527 to a vertical signal line 505 and MOS transistor switches 503 and 504 for connecting the horizontal signal line 528 to the vertical signal line 505 are selected by the vertical shift register 507. Also provided in this circuit are MOS transistor switches 520 and 521 adapted to sweep out noise charge on the horizontal signal lines 527 and 528, a sweep-out gate line 522 and a sweep-out drain 523. In this modification of FIG. 12, when any one of the sets of the MOS transistor switches 102 and 103, 202 and 203, 302 and 303 and 402 and 403 is selected by means of the vertical shift register 507 and horizontal shift register 506, a signal charge generated from any one of the photodiodes 101 to 401 receiving incident light is transferred to the vertical signal line 505 through the horizontal signal line 527 or 528 and delivered out of the device output terminal connected to the vertical signal line 505. Structurally, the MOS transistor switches 501, 502 and 503, 504 for connecting the vertical signal line 505 to the horizontal signal lines 527 and 528, respectively, may take the same structure as that of the MOS transistor switches 515 and 516 in FIG. 3, that is, shown in FIG. 4. In this case, the wiring conductor 24 in FIG. 4 is so modified as to be connected to the horizontal signal line 527 or 528 in FIG. 12 and the wiring conductor 26 in FIG. 4 is so modified as to be connected to the vertical signal line 505 in FIG. 12. In accordance with this modification of FIG. 12, parasitic capacitance associated with the vertical signal line 505 can be reduced and leakage current between the horizontal signal line 527 or 528 and the vertical signal line 505 can be suppressed. In FIG. 12, the respective photocells include a set of the photodiode 101 and MOS transistor switches 102 and 103, a set of the photodiode 201 and MOS transistor switches 202 and 203, a set of the photodiode 301 and MOS transistor switches 302 and 303 and a set of the photodiode 401 and MOS transistor switches 402 and 403. One photocell may take any one of the structures of FIGS. 5, 9, 10 and 11. In this case, the wiring conductor 8 in FIG. 5 is so modified as to be connected to the horizontal signal line 527 or 528 in FIG. 12, the gate 3 in FIG. 5 is so modified as to be connected to the vertical gate line 508 or 509, and the gate 7 in FIG. 5 is so modified as to be connected to the horizontal gate line 524 or 525. This modified connection relationship between FIGS. 5 and 12 is also applicable to one photocell of FIG. 12 realized with the structure of FIG. 9, 10 or 11. Especially where the structure of FIG. 11 is applied to the FIG. 12 circuit, the MOS transistors 103 and 203 connected in common to the horizontal signal line 527 or the MOS transistors 303 and 403 connected in common to the horizontal line 528 correspond to the MOS transistor shared by a plurality of photocells. With the photocell having the structure obtained in this manner, parasitic capacitance associated with the horizontal signal line 527 or 528 can be reduced, and leakage current between each of the photodiodes 101 and 201 and the horizontal signal line 527 and between each of the photodiodes 301 and 401 and the horizontal signal line 528 can be suppressed.

The modified embodiments of FIGS. 6 to 11 have been described by way of the sectional structure of the MOS transistors 105 and 106 constituting the photocell but these structures shown in FIGS. 6 to 11 may also be applied to the MOS transistors 515 and 516 or MOS transistors 517 and 518 by connecting the wiring conductor 24 in FIG. 4 to the n-type diffusion layer 1 in FIGS. 6 to 11.

We claim:

1. A solid-state imaging device comprising:
a plurality of photoelectric conversion elements, arranged in matrix form within a semiconductor substrate of a first conductivity type, for storing signal electric charges in accordance with incident light;
first signal lines, arranged in parallel, for transmitting therethrough the signal electric charges stored in respective ones of said photoelectric conversion elements correspondingly coupled therewith and which are arrayed in a predetermined direction;
first switch means for respectively effecting a transfer of a signal electric charge stored in each photoelectric conversion element to a corresponding first signal line coupled therewith, said first switch means including a plurality of transfer means for coupling said plurality of photoelectric conversion elements to said first signal lines, each one of said plurality of transfer means is comprised of a first MOS transistor formed in said semiconductor substrate wherein one of a source and drain thereof is correspondingly associated with a respective one of said photoelectric conversion elements and a second MOS transistor provided above said semiconductor substrate on an insulating film wherein one of a source and drain thereof is electrically connected to the other of the source and drain of said first MOS transistor and the other of the source and drain thereof is coupled to a corresponding one of said first signal lines;
a second signal line for transferring said signal electric charges, provided from said first signal lines, to an output terminal of said device;
second switch means for transferring said signal electric charge on each first signal line to said second signal line; and
scanning means for scanning said first and second switch means in a predetermined sequence.

2. A solid-state imaging device according to claim 1, wherein said scanning means comprises first scanning means, having outputs coupled respectively in common to gate electrodes of said first MOS transistor and second MOS transistor of each one of said plurality of transfer means through a corresponding first gate line, for simultaneously scanning said first and second MOS transistors of said plurality of transfer means in predetermined sequence, and second scanning means for scanning said second switch means in predetermined sequence.

3. A solid-state imaging device according to claim 1, wherein said scanning means comprises first scanning means, having outputs coupled respectively in common to a gate electrode of the first MOS transistor of each one of said plurality of transfer means and said second switch means through a corresponding first gate line, for scanning said first MOS transistor of each one of said plurality of transfer means and said second switch means in predetermined sequence, and second scanning means, having outputs coupled respectively to a gate electrode of said second MOS transistor of each one of said plurality of transfer means on a corresponding second gate line, for scanning said second MOS transistor of each of said plurality of transfer means in predetermined sequence.

4. A solid-state imaging device according to claim 1, wherein each one of said photoelectric conversion elements includes a pn junction comprised of said semiconductor substrate and a first impurity-doped region of a second conductivity type formed in said semiconductor substrate, said first impurity-doped region being formed integrally with said one of a source and drain of said first MOS transistor, wherein said other of the source and drain of said first MOS transistor is comprised of a second impurity-doped region of the second conductivity type formed in said semiconductor substrate, a gate electrode thereof is provided above said semiconductor substrate through part of said insulating film, and wherein said second MOS transistor has said one and said other of the source and drain thereof respectively comprised of third and fourth impurity-doped regions of the second conductivity type formed in a semiconductor film of the first conductivity type provided above said semiconductor substrate on said insulating film and a gate electrode thereof provided above said semiconductor film on a different insulating film.

5. A solid-state imaging device according to claim 4, wherein said other of the source and drain of said first MOS transistor is electrically connected to said one of a source and drain of said second MOS transistor with a metal wiring conductor.

6. A solid-state imaging device according to claim 5, wherein said second MOS transistor is disposed above an isolation region between pixel regions comprising said photoelectric conversion element and said first MOS transistor.

7. A solid-state imaging device according to claim 5, wherein said second MOS transistor is disposed above a pixel region comprised of said photoelectric conversion element and said first MOS transistor.

8. A solid-state imaging device according to claim 6, wherein said other of the source and drain of said second MOS transistor is shared by adjacent two pixels.

9. A solid-state imaging device according to claim 4, wherein said semiconductor film is prepared using said other of the source and drain of said first MOS transistor as a seeding region, whereby said other of the source and drain of said first MOS transistor is connected directly to said one of a source and drain of said second MOS transistor.

10. A solid-state imaging device according to claim 9, wherein said second MOS transistor is disposed above an isolation region between pixel regions comprising said photoelectric conversion element and said first MOS transistor.

11. A solid-state imaging device according to claim 9, wherein the gate electrodes of said first and second MOS transistors are interconnected together to cover said other of the source and drain of said first MOS transistor and said one of a source and drain of said second MOS transistor.

12. A solid-state imaging device according to claim 1, wherein each one of said photoelectric conversion elements includes a pn junction comprised of said semiconductor substrate and a first impurity-doped region of a second conductivity type formed in said semiconductor substrate, said first impurity-doped region being formed integrally with said one of a source and drain of said first MOS transistor, wherein said other of the source and drain of said first MOS transistor is comprised of a second impurity-doped region of the second conductivity type formed in said semiconductor substrate, a gate electrode thereof is provided above said semiconductor substrate on part of said insulating film, and wherein second MOS transistor has said one and said other of the source and drain thereof respectively comprised of third and fourth impurity-doped regions of the second conductivity type which are formed on a semiconductor film of the first conductivity type provided above at least said other of the source and drain and gate electrode of said first MOS transistor on part of said insulating film, the gate electrode of said first MOS transistor being shared by said second MOS transistor as the gate electrode thereof, said semiconductor film being prepared using said other of the source and drain of said first MOS transistor as a seeding region, and said other of the source and drain of said first MOS transistor is connected directly to said one of a source and drain of said second MOS transistor.

13. A solid-state imaging device according to claim 12 wherein said second MOS transistor is disposed above the region of said first MOS transistor.

14. A solid-state imaging device according to claim 12, wherein said second MOS transistor is disposed above the region of said other of the source and drain and said gate electrode of said first MOS transistor.

15. A solid-state imaging device according to claim 1, wherein said second switch means includes a plurality of second transfer means, each one thereof is comprised of a third MOS transistor having one of a source and drain thereof coupled to a respective first signal line and a fourth MOS transistor having one of a source and drain thereof electrically connected to the other of the source and drain of said third MOS transistor and the other of the source and drain thereof being coupled to said second signal line, said third MOS transistor being formed in said semiconductor substrate and said fourth transistor being provided above said semiconductor substrate on said insulating film.

16. A solid-state imaging device according to claim 15, wherein in each one of said plurality of second transfer means said third MOS transistor has said one and said other of the source and drain thereof respectively comprised of first and second impurity-doped regions of a second conductivity type formed in said semiconductor substrate and a gate electrode thereof provided above said semiconductor substrate on part of said insulating film, and said fourth MOS transistor has said one and said other of the source and drain thereof respectively comprised of third and fourth impurity-doped regions of the second conductivity type formed in a semiconductor film of the first conductivity type provided above said semiconductor substrate on said insulating film and a gate electrode thereof provided above said semiconductor film on a different insulating film.

17. A solid-state imaging device according to claim 16, wherein said other of the source and drain of said third MOS transistor is electrically connected to said one of a source and drain of said fourth MOS transistor with a metal wiring conductor.

18. A solid-state imaging device according to claim 17, wherein said fourth transistor is disposed above an isolation region.

19. A solid state imaging device according to claim 16, wherein said fourth MOS transistor is disposed above a region of said semiconductor substrate which includes said third MOS transistor.

20. A solid-state imaging device according to claim 18, wherein said other of the source and drain of said fourth MOS transistor is common to said other of the source and drain of the fourth MOS transistor of at least two of said plurality of second transfer means.

21. A solid-state imaging device according to claim 16, wherein said semiconductor film is prepared using said other of the source and drain of said third MOS transistor as a seeding region, and wherein said other of the source and drain of said third MOS transistor is connected directly to said one of a source and drain of said fourth MOS transistor.

22. A solid-state imaging device according to claim 21, wherein said fourth MOS transistor is disposed above an isolation region.

23. A solid-state imaging device according to claim 21, wherein the gate electrodes of said third and fourth MOS transistors are interconnected together to cover said other of the source and drain of said third MOS transistor and said one of the source and drain of said fourth MOS transistor.

24. A solid-state imaging device according to claim 15, wherein in each one of said plurality of second transfer means said third MOS transistor has said one and said other of the source and drain thereof respectively comprised of first and second impurity-doped regions of a second conductivity type which are formed in said semiconductor substrate and a gate electrode thereof provided above said semiconductor substrate on part of said insulating film, and said fourth MOS transistor has said one and said other of the source and drain thereof respectively comprised of third and fourth impurity-doped regions of the second conductivity type which are formed in a semiconductor film of the first conductivity type provided above at least other of the source and drain and gate electrode of said third MOS transistor on part of said insulating film, said gate electrode of said third MOS transistor being shared by said fourth MOS transistor as the gate electrode thereof, said semiconductor film being prepared using said other of the source and drain of said third MOS transistor as a seeding region, and said other of the source and drain of said third MOS transistor being connected directly to said one of a source end drain of said fourth MOS transistor.

25. A solid-state imaging device according to claim 24, wherein said fourth MOS transistor is disposed above a region of said semiconductor substrate which includes said third MOS transistor.

26. A solid-state imaging device according to claim 24, wherein said fourth MOS transistor is disposed above the region of said other of the source and drain and said gate electrode of said third MOS transistor.

27. A solid-state imaging device comprising:
a plurality of photoelectric conversion elements, arranged in matrix form with a semiconductor substrate of a first conductivity type, for storing signal electric charges in accordance with incident light;
first signal lines, arranged in parallel, for transmitting therethrough the signal electric charges stored in respective ones of said photoelectric conversion elements correspondingly coupled therewith and which are arrayed in a predetermined direction;
first switch means for respectively effecting a transfer of a signal electric charge stored in each photoelectric conversion element to a corresponding first signal line coupled therewith;
a second signal line for transferring said signal electric charges, provided from said first signal lines, to an output terminal of said device;
second switch means for transferring said signal electric charge on each first signal line to said second signal line, said second switch means including a plurality of transfer means for coupling said first signal lines to said second signal line, each one of said plurality of transfer means being comprised of a first MOS transistor formed in said semiconductor substrate and having one of a source and drain thereof electrically coupled to a respective one of said first signal lines and a second MOS transistor provided above said semiconductor substrate on an insulating film and having one of a source and drain thereof electrically connected to the other of the source and drain of said first MOS transistor and the other of the source and drain thereof being electrically coupled to said second signal line; and
scanning means for scanning said first and second switch means in predetermined sequence.

28. A solid-state imaging device according to claim 27, wherein in each one of said plurality of transfer means said first MOS transistor has said one and said other of the source and drain thereof respectively comprised of first and second impurity-doped regions of a second conductivity type formed in said semiconductor substrate and a gate electrode thereof provided above said semiconductor substrate on part of said insulating film, and said second MOS transistor has said one and said other of the source and drain thereof respectively comprised of third and fourth impurity-doped regions of the second conductivity type formed in a semiconductor film of the first conductivity type provided above said semiconductor substrate on said insulating film and a gate electrode thereof provided above said semiconductor film on a different insulating film.

29. A solid-state imaging device according to claim 28, wherein said other of the source and drain of said first MOS transistor is electrically connected to said one of a source and drain of said second MOS transistor with a metal wiring conductor.

30. A solid-state imaging device according to claim 29, wherein said second MOS transistor is disposed above an isolation region.

31. A solid-state imaging device according to claim 29, wherein said second MOS transistor is disposed above a region of said semiconductor substrate which includes said first MOS transistor.

32. A solid-state imaging device according to claim 30, wherein said other of the source and drain of said second MOS transistor is common to said other of the source and drain of the second MOS transistor of at least two of said plurality of transfer means.

33. A solid-state imaging device according to claim 28, wherein said semiconductor film is prepared using said other of the source and drain of said first MOS transistor as a seeding region, and wherein said other of the source and drain of said first MOS transistor is connected directly to said one of a source and drain of said second MOS transistor.

34. A solid-state imaging device according to claim 33, wherein said second MOS transistor is disposed above an isolation region.

35. A solid-state imaging device according to claim 33, wherein the gate electrodes of said first and second MOS transistors are interconnected together to cover said other of the source and drain of said first MOS transistor and said one of a source and drain of said second MOS transistor.

36. A solid-state imaging device according to claim 1, wherein said one of a source and drain of each first MOS transistor is formed as part of a corresponding photoelectric conversion element.

37. A solid-state imaging device comprising:
a plurality of photoelectric conversion elements, arranged in matrix form within a semiconductor substrate of a first conductivity type, for storing signal electric charges in accordance with incident light;
first signal lines, arranged in parallel, for transmitting therethrough the signal electric charges stored in respective ones of said photoelectric conversion elements correspondingly coupled therewith and which are arrayed in a predetermined direction;
first switch means for respectively effecting a transfer of a signal electric charge stored in each photoelectric conversion element to a corresponding first signal line coupled therewith, said first switch means including a plurality of first transfer means for coupling said plurality of photoelectric conversion elements to said first signal lines, each one of said plurality of first transfer means is comprised of a first MOS transistor wherein one of a source and drain thereof is correspondingly associated with a respective one of said photoelectric conversion elements and a second MOS transistor wherein one of a source and drain thereof is electrically connected to the other of the source and drain of said first MOS transistor and the other of the source and drain thereof is electrically coupled to a corresponding one of said first signal line;
a second signal line for transferring said signal electric charges on said first signal lines to an output terminal of said device;
second switch means for transferring said signal electric charge on each one of said first signal lines to said second signal line, said second switch means including a plurality of second transfer means for coupling said first signal lines to said second signal line, each one of said plurality of second transfer means being comprised of a third MOS transistor having one of a source and drain thereof electrically coupled to a corresponding one of said first signal lines and a fourth MOS transistor having one of a source and drain thereof electrically connected to the other of the source and drain of said third MOS transistor and the other of the source and drain thereof being electrically coupled to said second signal line; and
scanning means for scanning said first and second switch means in predetermined sequence,
wherein at least one of said second and fourth MOS transistors are provided above said semiconductor substrate on an insulating film.

38. A solid-state imaging device according to claim 37, wherein in each one of said plurality of second transfer means said third MOS transistor has said one and said other of the source and drain thereof respectively comprised of first and second impurity-doped regions of a second conductivity type formed in said semiconductor substrate and a gate electrode thereof provided above said semiconductor substrate on part of said insulating film, and said fourth MOS transistor has said one and said other of the source and drain thereof respectively comprised of third and fourth impurity-doped regions of the second conductivity type formed in a semiconductor film of the first conductivity type provided above said semiconductor substrate on said insulating film and a gate electrode thereof provided above said semiconductor film on a different insulating film.

39. A solid-state imaging device according to claim 38, wherein the other of the source and drain of said third MOS transistor is electrically connected to said one of a source and drain of said fourth MOS transistor with a metal wiring conductor.

40. A solid-state imaging device according to claim 39, wherein said fourth MOS transistor is disposed above an isolation region.

41. A solid-state imaging device according to claim 39, wherein said fourth MOS transistor is disposed above a region of said semiconductor substrate which includes said third MOS transistor.

42. A solid-state imaging device according to claim 40, wherein said other of the source and drain of said fourth MOS transistor is common to said other of the source and drain of the fourth MOS transistor of at least two of said plurality of second transfer means.

43. A solid-state imaging device according to claim 38, wherein said semiconductor film is prepared using said other of the source and drain of said third MOS transistor as a seeding region, and wherein said other of the source and drain of said third MOS transistor is connected directly to said one of a source and drain of said fourth MOS transistor.

44. A solid-state imaging device according to claim 43, wherein said fourth MOS transistor is disposed above an isolation region.

45. A solid-state imaging device according to claim 43, wherein the gate electrodes of said third and fourth MOS transistors are interconnected together to cover said other of the source and drain of said third MOS transistor and said one of a source and drain of said fourth MOS transistor.

46. A solid-state imaging device according to claim 37, wherein said one of a source and drain of each first MOS transistor is formed as part of a corresponding one of said photoelectric conversion elements.

47. A solid-state imaging device according to claim 1, wherein said second MOS transistor is formed as a silicon-on-insulator (SOI) type MOS transistor above a surface of said semiconductor substrate on which said plurality of photoelectric conversion elements are formed.

48. A solid-state imaging device according to claim 27, wherein said second MOS transistor is formed as a silicon-on-insulated (SOI) type MOS transistor above a surface of said semiconductor substrate on which said plurality of photoelectric conversion elements are formed.

49. A solid-state imaging device according to claim 37, wherein said second and fourth MOS transistors are respectively formed as silicon-on-insulator (SOI) type MOS transistors above a surface of said semiconductor substrate on which said plurality of photoelectric conversion elements are formed.

* * * * *